United States Patent [19]

Shiozaki

[11] Patent Number: 5,718,773
[45] Date of Patent: Feb. 17, 1998

[54] PHOTOELECTRIC TRANSDUCER

[75] Inventor: Atsushi Shiozaki, Soraku-gun, Japan

[73] Assignee: Canon Kabushiki Kaisha, Tokyo, Japan

[21] Appl. No.: 769,318

[22] Filed: Dec. 19, 1996

Related U.S. Application Data

[63] Continuation of Ser. No. 517,127, Aug. 21, 1995, abandoned.

[30] Foreign Application Priority Data

Aug. 23, 1994 [JP] Japan ............... 6-198845

[51] Int. Cl.$^6$ ............................................. H01L 31/04
[52] U.S. Cl. ................ 136/256; 136/258; 136/259; 257/437; 359/580; 359/585; 428/432; 428/469
[58] Field of Search ............ 136/256, 258 AM, 136/258 PC, 259; 257/436, 437; 359/580, 585; 428/432, 469

[56] References Cited

U.S. PATENT DOCUMENTS

| 4,419,533 | 12/1983 | Czubatyj et al. | 136/259 |
| 4,694,116 | 9/1987 | Hayashi et al. | 136/256 |
| 5,064,477 | 11/1991 | Delahoy | 136/256 |

FOREIGN PATENT DOCUMENTS

| 62-16033 | 4/1987 | Japan. | |
| 63-9158 | 1/1988 | Japan | 136/256 |
| 4-70788 | 11/1992 | Japan. | |

OTHER PUBLICATIONS

K. Takahashi et al., "Amorphous Silicon Solar Cells", John Wiley & Sons, New York (1986), pp. 193-194.

*Primary Examiner*—Aaron Weisstuch
*Attorney, Agent, or Firm*—Fitzpatrick, Cella, Harper & Scinto

[57] ABSTRACT

A photoelectric transducer is provided which comprises a first electrode, a second electrode constituted of an antireflection layer, and a semiconductor layer between the first electrode and the second electrode. The antireflection layer comprises a laminated member of a first tin oxide layer containing a first crystalline oxide of grain size of not larger than 20 nm, and a second thin oxide layer containing a second oxide of a second thin oxide layer containing a second crystalline oxide of grain size of not larger than 20 nm.

32 Claims, 3 Drawing Sheets

PHOTOELECTRIC TRANSDUCER

This application is a continuation of application Ser. No. 08/517,127 filed Aug. 21, 1995, now abandoned.

BACKGROUND OF THE INVENTION

1. Field of the Invention

The present invention relates to a photoelectric transducer, particularly to a photoelectric transducer which has an antireflection layer constituted by a laminated member formed of alternating different oxide layers. The photoelectric transducer can be adapted for use as solar cells and various sensors.

2. Related Background Art

Photoelectric transducers are practically used as independent power sources for electric apparatuses, and as alternate energy source replacements for conventional power sources. The photoelectric transducers are still under development to further improve the power generating efficiency.

One of the problems to be solved is improvement of utilization efficiency of incident light. The photoelectric transducing elements of the transducers include crystal types employing monocrystalline or polycrystalline silicon of high transducing efficiency, amorphous silicon (hereinafter referred to as "a-Si") which can be employed at a low cost, and thin film semiconductor types employing a compound semiconductor such as CdS and $CuInSe_2$. In any of the photoelectric transducers, the most important requirement is effective utilization of incident light.

The usual technique for improving utilization of incident light employs (1) an antireflection layer for preventing reflection of light at the light-incident face so as to allow more light to reach the photoelectric transducing element; (2) a light-scattering layer for scattering incident light to increase the optical path length in the photoelectric transducing element; or (3) a back face reflection layer for reflecting unabsorbed light back into the photoelectric transducing element.

For instance, Japanese Patent Publication No. 62-16033 discloses a multilayered antireflection layer having layers of successively changing refraction index which utilizes light interference. Japanese Patent Publication No. 4-70788 discloses a technique of light scattering by use of a transparent electroconductive layer having large crystal grains for increasing absorption efficiency. U.S. Pat. No. 4,419,533 discloses a method utilizing a back face reflection layer comprising a metal layer having a surface texture structure and a transparent layer formed thereon.

Combination of the above techniques was expected to raise the efficiency of the photoelectric transducer and to lower the cost of the obtained electric energy. However, simple combination of the above techniques is not that effective in lowering the cost of the resulting electric energy. Consequently, the photoelectric transducer is not widely used as an alternative power source.

SUMMARY OF THE INVENTION

An object of the present invention is to provide a photoelectric transducer which exhibits higher transducing efficiency with a smaller transducing area.

According to the first embodiment of the present invention, the photoelectric transducer comprises a first electrode, a second electrode constituted of an antireflection layer, and a semiconductor layer placed between the first electrode and the second electrode, wherein the antireflective layer comprises a laminated member of a first thin oxide layer containing a first crystalline oxide of grain size of not larger than 20 nm and a second thin oxide layer containing a second crystalline oxide of grain size of not larger than 20 nm.

In the photoelectric transducer of the first embodiment preferably, (1) the above laminated member is formed by alternately laminating one or more of the first thin oxide layers and one or more of the second thin oxide layers; (2) the first thin oxide layer contains at least one metal oxide selected from oxides of cadmium, indium, and tin, and the second thin oxide layer contains at least one metal oxide selected from oxides of zinc and titanium; (3) the first thin oxide layer has a thickness ranging from 10 to 20 nm, and the second thin oxide layer has a thickness ranging from 50 to 10 nm; (4) the semiconductor layer contains amorphous silicon; (5) the semiconductor layer contains microcrystalline silicon; (6) the semiconductor layer has a pin junction or a nip junction; (7) the first electrode is an electroconductive base member; (8) the electroconductive base member of the above item (7) is a stainless steel plate, a galvanized steel plate, an aluminum plate, or a copper plate; (9) a reflective metal layer is provided on the electroconductive base member of the above item (7); (10) on the electroconductive base member of the above item (7), a reflective metal layer and a transparent electroconductive layer are provided; (11) the transparent electroconductive layer of the above item (10) is a zinc oxide layer having fine projections and recesses on the surface thereof; (12) a transparent electrode is provided between the antireflection layer and the semiconductor layer; (13) a transparent electrode is provided on the face of the antireflection layer opposite to the semiconductor layer; and (14) the antireflection layer is provided adjacent to a transparent base member on the side opposite to the semiconductor layer.

According to the second embodiment of the present invention, the antireflection layer comprises a laminated member comprising a first thin oxide layer containing a first crystalline oxide of grain size of not larger than 20 nm, and a second thin oxide layer containing a second crystalline oxide of grain size of not larger than 20 nm.

In the antireflection layer of the second embodiment preferably, (1) the above laminated member is formed by alternately laminating one or more of the first thin oxide layers and one or more of the thin second oxide layers; (2) the first thin oxide layer contains at least one metal oxide selected from oxides of cadmium, indium and tin, and the second thin oxide layer contains at least one metal oxide selected from oxides of zinc and titanium; (3) the first thin oxide layer has a thickness ranging from 10 to 20 nm, and the second thin oxide layer has a thickness ranging from 50 to 10 nm.

According to the third embodiment of the present invention, the electrode substrate comprises a laminated member having a first thin oxide layer containing a first crystalline oxide of grain size of not larger than 20 nm, and a base member.

In the electrode substrate of the third embodiment, preferably (1) the above laminated member is formed by alternately laminating one or more of the first thin oxide layers and one or more of the thin second oxide layers; (2) the first thin oxide layer contains at least one metal oxide selected from oxides of zinc and titanium; (3) the first thin oxide layer has a thickness ranging from 10 to 20 nm, and the second thin oxide layer has a thickness ranging from 5 to 10 nm.

DETAILED DESCRIPTION OF THE PREFERRED EMBODIMENTS

The photoelectric transducer of a preferred embodiment of the present invention is produced by successively laminating, on a surface of an electroconductive base member, a semiconductor layer, an antireflection layer, and collecting electrode, or by successively laminating, on a transparent base member, an antireflection layer, a semiconductor layer, and a collecting electrode. The antireflection layer comprises a laminated member of alternating oxide layers A containing at least one element selected from cadmium (Cd), indium (In), and tin (Sn), and oxide layers B containing an element selected from zinc (Zn) and titanium (Ti), and the crystal grains on the surface of the antireflection layer have a grain size not larger than 20 nm.

In the present invention, the crystal grain size in the antireflection layer can be effectively controlled to be small by limiting the thickness of the oxide layer A and the oxide layer B. Consequently, the reflectivity of the antireflection layer is lowered, and the quantity of the incident light which reaches the active semiconductor layer(s) is increased to give improvement in photoelectric transducing efficiency.

Figure 1:
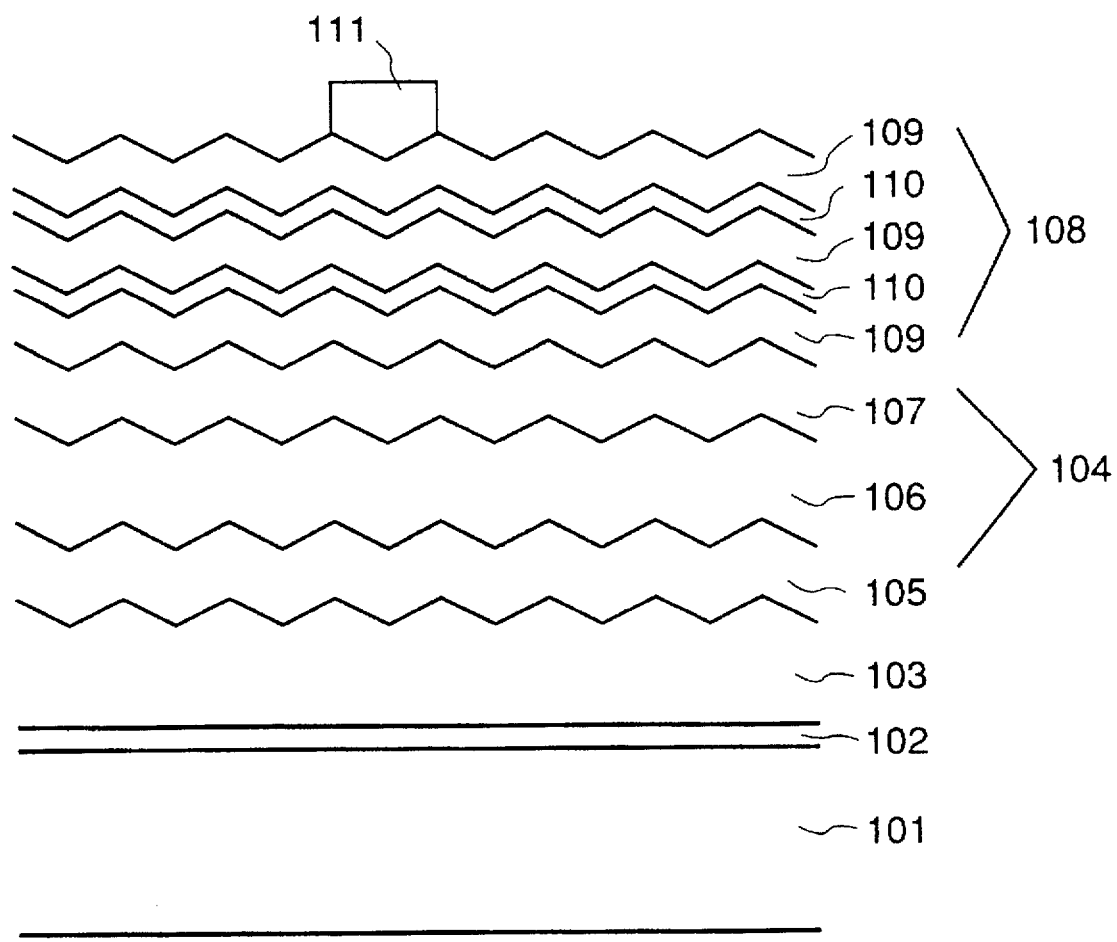
FIG. 1 is a schematic sectional view of a thin film semiconductor type photoelectric transducer according to Example 1.

The steps of producing the photoelectric transducer of the present invention are described below by reference to FIG. 1.

(1) On an electroconductive base member 101, there is formed a layer 102 of a metal having a high reflectivity. This metal layer 102 may be omitted in the case where the base member is itself sufficiently reflective.

(2) A transparent conductive layer 103 having a surface roughness of not more than several hundred nm is formed on the surface of the highly reflective metal layer 102.

(3) A semiconductor junction 104 is formed on the surface of the transparent layer 103. This semiconductor junction 104 is constituted of an n-type a-Si layer 105, an i-type a-Si layer 106, and a p-type a-Si layer 107. When the semiconductor junction is thin, the entire semiconductor junction tends to have roughness like the transparent layer 103.

(4) An antireflection layer 108 is formed on the semiconductor junction 104. This antireflection layer 108 is constructed from two different kinds of oxide layers 109 and 110 laminated alternately.

(5) A comb type collecting electrode 111 is formed on the antireflection layer 108.

The present invention is more fully explained below.

Base Member

When an electroconductive base member is employed, the base member 101 is a metal plate. In particular, a stainless steel plate, a galvanized steel plate, an aluminum plate, or a copper plate is suitable for the base member because of inexpensiveness thereof. These metal plates may be used in a cut piece shape, or in a long sheet shape depending on the thickness of the plate. The long sheet shape of the material wound in a roll is suitable for continuous production and is convenient for storage and transportation. In some uses, a crystalline base member such as a silicon plate, a glass plate, or a ceramic plate may be used. When the base member is transparent, that is, when a glass plate is used, the light may be introduced through the glass base member. In this case the semiconductor layer and the antireflection layer described later are placed in reverse order.

The surface of the base member may be polished. A well-finished material such as bright-annealed stainless steel plate may be used without special polishing.

If the base member is not sufficiently reflective, a metal layer 102 is provided on the base member 101. The metal layer 102 is made of a material having a high reflectivity, such as silver, copper, and aluminum, and may be formed by vapor deposition by resistance heating or electron beam irradiation, sputtering, ion plating, CVD, metal plating, or a like method.

Further, a thin transparent conductive layer 103 having a surface with fine roughness may be formed on the base member 101. The transparent layer 103 can be formed by sputtering or a like method. The transparent layer 103 may have a certain level of resistance to control the electric current flowing through defects in the semiconductor layer, and is suitably formed from a material such as tin oxide and zinc oxide.

Semiconductor Layer

As the semiconductor layer 104, a thin layer of amorphous Si (referred to as "a-Si") or microcrystalline Si (referred to as "μc-Si") is suitably used which is formed, for example, from gaseous $SiH_4$, etc. as the starting material by CVD employing high-frequency power or microwave power. The semiconductor layer 104 usually has an nip type semiconductor junction. In formation of the nip type semiconductor layer 104, an n-type a-Si layer 105 is formed from gaseous $SiH_4$, $SiF_4$, $PH_3$, $H_2$, etc. on the transparent layer 103; then an i-type a-Si layer 106 is formed from gaseous $SiH_4$, $SiF_4$, $H_2$, etc. on the n-type a-Si layer 105; and further, a p-type μc-Si layer 107 is formed from gaseous $SiH_4$, $BF_3$, $H_2$, etc. on the i-type a-Si layer 106. The semiconductor layer is not limited to an a-Si thin layer and a μc-Si thin layer. The order of the semiconductor junction may be nip or pin. Furthermore, the semiconductor junction may be constituted of plural layers.

Antireflection Layer

The antireflection layer 108 is composed, for example, mainly of indium oxide, or tin oxide, or a mixture thereof, and in many cases serves also as the transparent electrode. The thickness (d) of the antireflection layer 108 is preferably about $\lambda/(4n)$, where "λ" is the wavelength of light to be mainly absorbed by the transducing element, and "n" is the refractive index of the antireflection layer. The antireflection layer, preferably, is transparent to the wavelength range of light to be mainly absorbed, and has a low refractive index and a smooth surface. The wavelength range of light to be mainly absorbed depends on the characteristics of the semiconductor. For instance, Si which contains Ge has a reduced band gap, and longer wavelengths of light is preferably in comparison with Si which does not contain Ge.

In the photoelectric transducer which is formed by successively laminating on a transparent base member, an antireflection layer, a semiconductor layer, and a collecting electrode, the antireflection layer must function as a transparent electrode, and must have a suitable electric resistance.

Generally, the crystal grains constituting a thin layer tend to become larger with increase of the layer thickness, causing roughness of the surface of the thin layer. The surface roughness will disadvantageously decrease the quantity of light introduced into the thin layer. To decrease the surface roughness, it has been found to be effective by the present inventors to form the antireflection layer 108 by a laminated member of alternating different oxide layers composed of different substances as follows.

(1) As the first layer of the antireflection layer 108, a layer (oxide layer A) 109 composed, for example, of indium oxide or tin oxide is deposited to such a thickness that the crystal grains do not grow to a size of 20 nm or larger; (2) on the first layer of the antireflection layer 108, a layer (oxide layer B) 110 composed, for example, of zinc oxide which is different in degree of crystal grain growth from the substance of the first layer is deposited as the second layer to such a thickness that the crystal grains do not grow to a size of 20 nm or larger; and (3) above steps (1) and (2) are repeated several times to obtain a laminated structure of alternating different oxide layers having a total thickness d of $\lambda/(4n)$ where "$\lambda$" is the wavelength of light to be mainly absorbed, and "n" is the refractive index of the antireflection layer.

Through the above steps, an antireflection layer can be formed which is transparent in the visible light wavelength region, has appropriate electric resistance owing to the extremely small thickness of zinc oxide layer 110, and has a smooth surface formed from fine crystal grains having a grain size of not larger than 20 nm.

Collecting Electrode

The collecting electrode 111 is formed on the face of the transparent electrode, namely the antireflection layer 108, for the purpose of decreasing the surface resistivity of above antireflection layer 108. The collecting electrode 111 may be a thin layer of a metal such as Ag, Cr, Ni, Al, Ag, Au, Ti, Pt, Cu, Mo, and W, or an alloy of the above metals. The thin layer may be laminated. The shape and the area of the collecting electrode 111 is suitably designed so as to permit a sufficient amount of light introduction through the transparent electrode or the antireflection layer 108 to the active semiconductor layer 104. The area of the collecting electrode 111 is preferably not more than 15%, more preferably not more than 10% of the light-receiving area. The sheet resistivity of the collecting electrode 111 is preferably not higher than 50 $\Omega/cm^2$, more preferably not higher than 10 $\Omega/cm^2$.

Photoelectric Transducer

The photoelectric transducer includes combinations of the base member, the semiconductor layer, the antireflection layer, and the collecting electrode as mentioned above. A structure formed on an electroconductive base member by successive lamination of a semiconductor layer, an antireflection layer, and a collecting electrode; or a structure formed on a transparent base member by successive lamination of a semiconductor layer, an antireflection layer, and a collecting electrode; or a structure formed on a transparent base member by successive lamination of an antireflection layer, a semiconductor layer, and a collecting electrode is suitably used as the photoelectric transducer.

Oxide Layer A

The material for the oxide layer A 109 is preferably at least one oxide of an element selected from cadmium (Cd), indium (In), and tin (Sn). Optically, this oxide layer is preferably transparent in the visible light wavelength region. The thickness of the layer is preferably in the range where the crystal grains do not grow larger than 20 nm, preferably in the range of from 10 nm to 20 nm.

The oxide layer A, which is formed on the face of the aforementioned semiconductor layer 104 or on the oxide layer B mentioned below, preferably has sufficient adhesion to the semiconductor layer 104 or the oxide layer B. The oxide layer A must be formed under conditions that do not cause pinholes even when the layer is as thin as about 10 nm.

Oxide Layer B

The material for the oxide layer B 110 is preferably an oxide containing, for example, zinc (Zn) or titanium (Ti). Optically, this oxide layer is also preferably transparent in the visible light wavelength region. The thickness of the layer is preferably in the range where the crystal grains do not grow larger than 20 nm, preferably in the range of from 5 nm to 10 nm.

The oxide layer B, which is formed on the face of the aforementioned semiconductor layer 104 or on the aforementioned oxide layer A, preferably has sufficient adhesion to the semiconductor layer 104 or the oxide layer A.

EXAMPLE 1

A photoelectric transducer was prepared which has an antireflection layer 108 on the face of a semiconductor layer 104, having the structure shown below. In the description below, "A" denotes an oxide layer A, and "B" denotes an oxide layer B. The total thickness of the antireflection layer was 61 nm.

Semiconductor layer/[Antireflection layer]=
Semiconductor layer/[A(17 nm)/B(5 nm)/A(17 nm/B(5 nm)/A(17 nm)]

The preparation steps of the photoelectric transducer of this Example are described below with reference to FIG. 1.

(1) the base member 101 was a stainless steel plate 5 cm square and 0.2 mm thick having a polished face. On the base member 101, a silver layer was deposited in a thickness of 60 nm as a metal layer 102 by means of a sputtering apparatus using a silver target under the following deposition conditions: base member temperature of 200° C., and input power per target unit area of 0.2 W/cm².

(2) On the thus formed metal layer 102, a zinc oxide layer of 500 nm thickness was formed as a transparent layer 103 by means of the same sputtering apparatus as used above by using zinc oxide target material under the following conditions: base member temperature of 420° C., argon inert gas atmosphere, gas flow rate of 50 sccm, pressure in the deposition chamber of 3 mTorr, and input power per target unit area of 2 W/cm².

(3) On the thus formed transparent layer 103, a semiconductor layer 104 was deposited by means of a capacitive coupled RF CVD apparatus (CHJ-3030, manufactured by Albac Co.).

The semiconductor layer 104 had an nip semiconductor junction formed by successive lamination of an n-type a-Si layer 105, an i-type a-Si layer 106, and a p-type μc-Si layer 107. The conditions of formation of the respective layers are shown in Table 1.

TABLE 1

| Layer | Gase used and flow rate (sccm) | | RF power (W) | Time of layer formation (min) | Pressure (Torr) | Base member temperature (°C.) |
|---|---|---|---|---|---|---|
| n-type layer 105 | SiH₄ | 300 | 200 | 5 | 1.0 | 250 |
| | SiF₄ | 4 | | | | |
| | PH₃/H₂ (diluted with 1% H₂) | 55 | | | | |

TABLE 1-continued

| Layer | Gase used and flow rate (sccm) | | RF power (W) | Time of layer formation (min) | Pressure (Torr) | Base member temperature (°C.) |
|---|---|---|---|---|---|---|
| i-type layer 106 | $H_2$<br>$SiH_4$<br>$SiF_4$<br>$H_2$<br>(diluted with 1% $H_2$) | 40<br>300<br>4<br>40 | 150 | 40 | 1.0 | 250 |
| p-type layer 107 | $SiH_4$<br>$BF_3/H_2$<br>(diluted with 1% $H_2$)<br>$H_2$ | 50<br>50<br><br>500 | 300 | 2 | 1.0 | 250 |

(4) The sample (5 cm square) on which the semiconductor layer 104 had been formed was cut to form four specimens (a, b, c, and d) each of 2.5 cm². The steps below were conducted with the specimens a and b.

Figure 2:
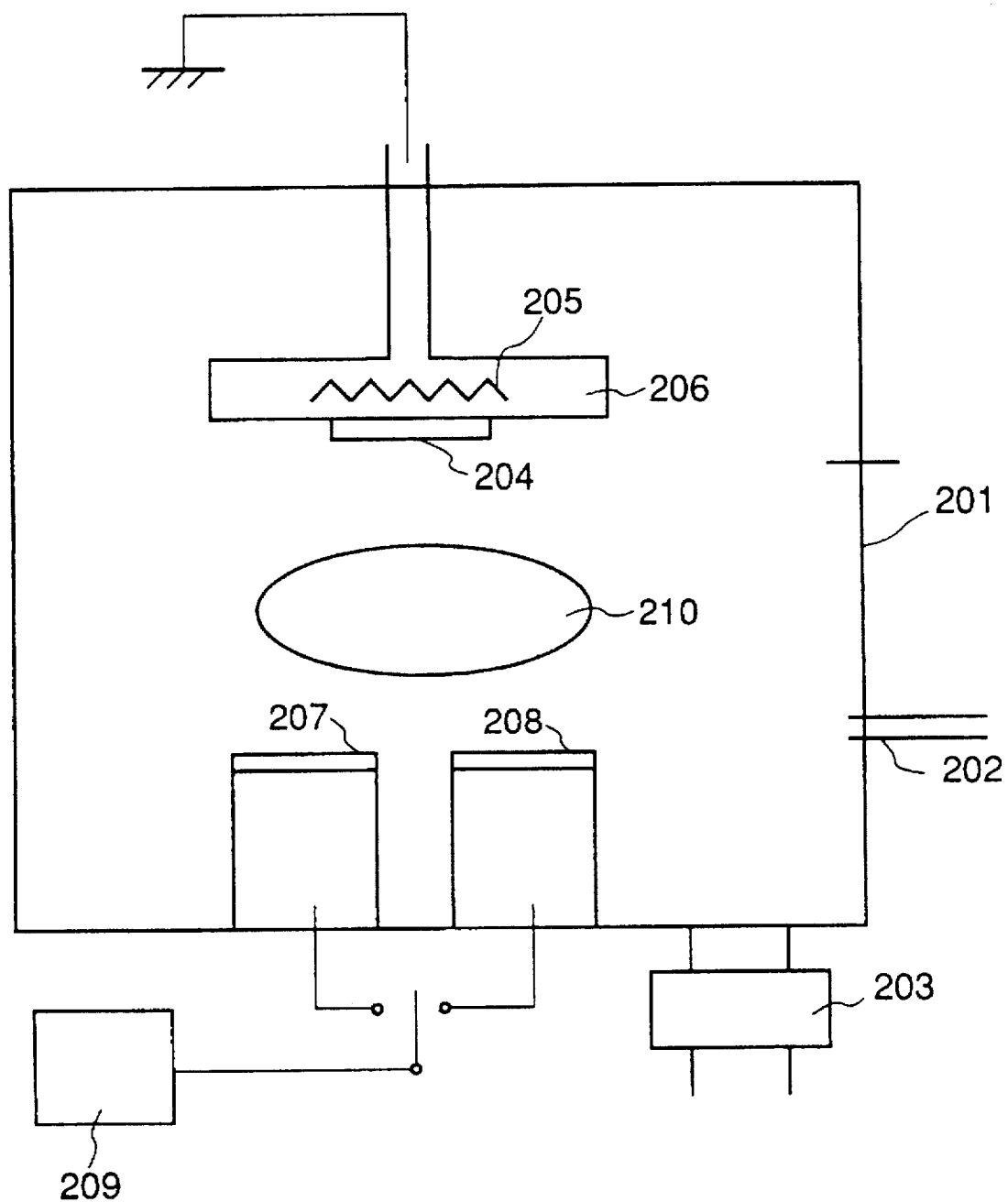
FIG. 2 is a schematic view of a sputtering apparatus suitable for producing an antireflection layer of a thin film semiconductor type photoelectric transducer according to Example 1.

(5) The two specimens a and b (204) were mounted on the face of the anode 206 of the DC magnetron sputtering apparatus shown in FIG. 2. A layer (oxide layer A) 109 composed of tin oxide and indium oxide was deposited in a thickness of 17 nm on the central portion of 2 cm² with the peripheral regions covered with a stainless steel mask by using a target 207 composed of indium oxide containing 10% by weight of tin oxide under the following deposition conditions: temperature of base member of 200° C., argon inert gas atmosphere, gas flow rate of 50 sccm, pressure in the deposition chamber of 3 mTorr, and input power per target unit area of 0.2 W/cm². In FIG. 2, reference numeral 201 indicates a vacuum vessel, 202 indicates a gas introducing tube, 203 indicates an exhaust valve, and the numeral 205 indicates a substrate heater.

(6) The sputtering power source 209 was then switched over to a zinc oxide target 208, and a layer (oxide layer B) 110 composed of zinc oxide was deposited in a thickness of 5 nm.

(7) The specimens (a and b) after step (6) were again subjected to the deposition of step (5).

(8) The specimens (a and b) after step (7) were again subjected to the deposition of step (6).

(9) The specimens (a and b) after step (7) were again subjected to the deposition of step (6).

(9) the specimens (a and b) after step (8) were again subjected to the deposition of step (5).

The antireflection layer 108 prepared through the above steps was transparent with respect to the visible light wavelength region, and had sufficiently low electric resistance. The surface was smooth and formed of fine crystal grains of not larger than 20 nm according to electron microscope observation.

(10) The reflectivity of specimen a was measured after step (9) by means of a spectrophotometer.

(11) After step 9, a collecting electrode 11 was formed with Ag paste by screen printing on an area corresponding to 2% of the surface area of the specimen b. A thin film semiconductor type photoelectric transducer thus was completed as a result of step (11).

Comparative Example 1

In this Comparative Example, the antireflection layer was of a single layer structure, which is different from Example 1. The layer constitution of the photoelectric transducer having a semiconductor layer 104 and an antireflection layer formed thereon was as below:

Semiconductor layer/[Antireflection layer]=
  Semiconductor layer/[A(60 nm)]

Here, "A" denotes "Oxide layer A".

The two specimens (c and d) prepared in Example 1 were used for formation of the above antireflection layer 108. The specimen c was used for reflectivity measurement with a spectrophotometer. On the face of the specimen d, a collecting electrode 111 was formed to complete a thin film semiconductor type photoelectric transducer.

Other operations and conditions were the same as in Example 1.

The antireflection layer 108 prepared in this Comparative Example was transparent in the visible light wavelength region, and had sufficiently low electric resistance. However, observation with an electron microscope showed that the surface thereof was formed of crystal grains of about 30 nm and was rougher than that in Example 1.

Figure 3:
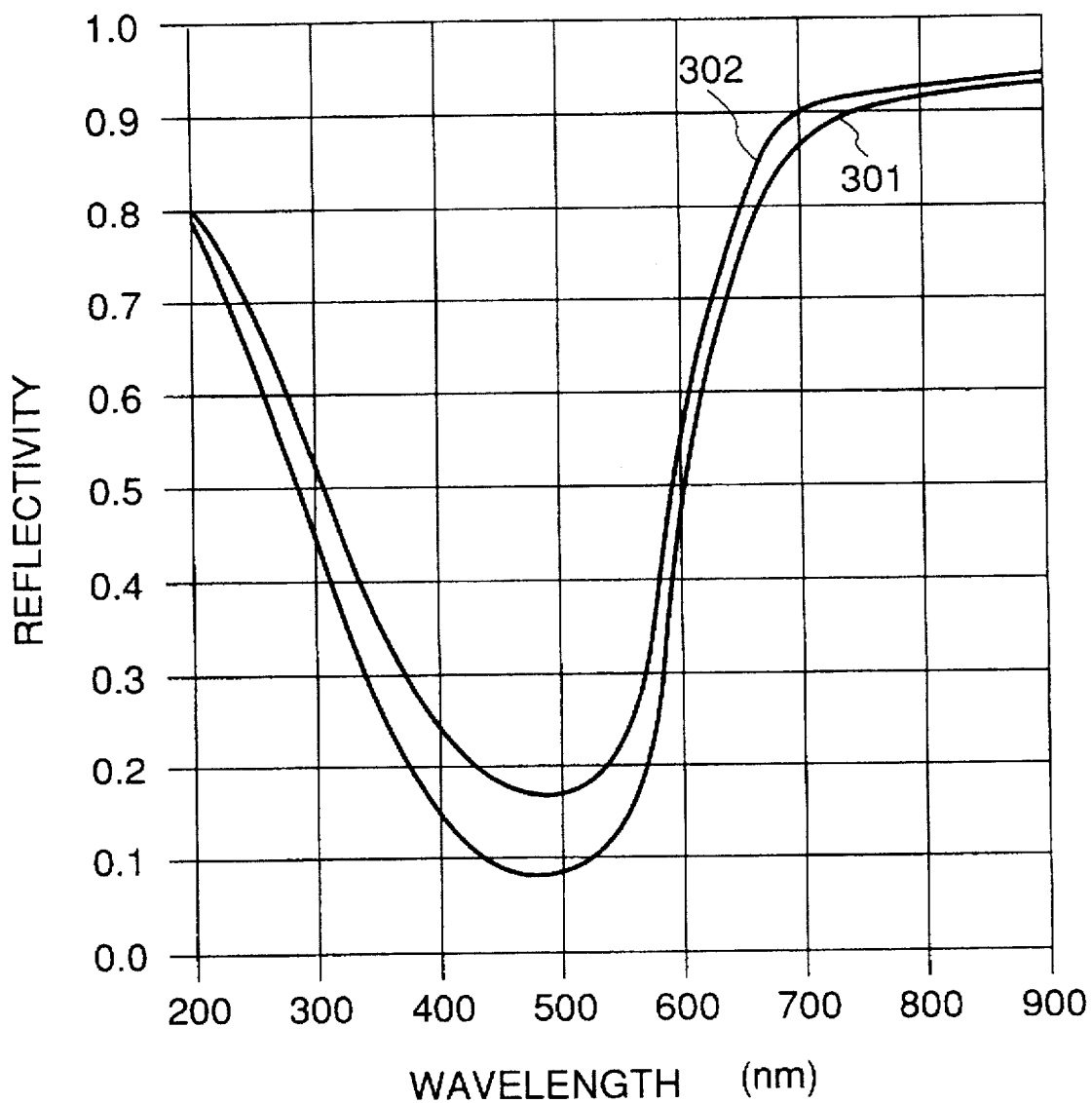
FIG. 3 is a graph showing the reflectivities of samples obtained in Example 1 and Comparative Example 1.

FIG. 3 shows the measured reflectivities of the specimen a of Example 1 (curve 301) and the specimen c of Comparative Example 1 (curve 302). The curve 301 shows lower reflectivity than the curve 302 over the measured wavelength range. Therefore, it was presumed that a larger amount of light is introduced into the semiconductor layer in Example 1 than in Comparative Example 1.

The specimen b of Example 1 and the specimen d of Comparative Example 1 were evaluated for their photoelectric transducing characteristics under illumination of AM 1.5 (100 mW/cm²). As a result the photoelectric transducing efficiency was estimated to be 9.7% for the specimen b, and 9.2% for the specimen d. The inventor presumed that this difference in photoelectric transducing efficiency probably resulted from the fact that the specimen d has a greater layer surface roughness than the specimen b which reduced the reflection prevention effect utilizing light interference. Accordingly, the transducing efficiency of the thin film semiconductor type photoelectric converter is understood to be improved by the antireflection layer structure as shown in Example 1.

The above results were also confirmed in the cases where the oxide layer A was an oxide containing at least one of cadmium (Cd), indium (In), and tin (Sn) and the oxide layer B was an oxide containing zinc (Zn) or titanium (Ti).

Though the above results were obtained in the case where the layer in contact with the semiconductor layer 104 and the collecting electrode 111 was the oxide layer A of the antireflection layer 108, the oxide layer B may be used in place of the oxide layer A.

Comparative Example 2

In this Comparative Example, the oxide layers B constituting the antireflection layer 108 were prepared from indium oxide, which is different from Example 1. Other operations and conditions were the same as in Example 1.

The antireflection layer 108 prepared in this Comparative Example was transparent in the visible light wavelength region, and had sufficiently low electric resistance. However, as a result of observation with an electron microscope, it was determined that the surface of the layer was formed from crystal grains of a grain size of about 30 nm, which was rougher than that of Example 1. The inventor presumed that in the case where an oxide layer having the same composition as the oxide layer A is used as the oxide layer B, the crystal lattice spacings of both oxide layers A and B became equal to each other, whereby the crystal growth was not prevented effectively.

The specimens of Example 1 and Comparative Example 1 were evaluated for their photoelectric transducing characteristics under illumination of AM 1.5 (100 mW/cm$^2$). Thereby, the photoelectric transducing efficiency was calculated to be 9.7% for the specimen of Example 1, and 9.2% for the specimen of Comparative Example 2.

Accordingly, it was found that the material of the oxide layer B must be different from the material of the oxide layer A.

EXAMPLE 2

The thicknesses of the oxide layers A constituting the antireflection of layer 108 were varied, so as to be different from those of Example 1. The layer constitution of the photoelectric transducer having a semiconductor layer 104 and an antireflection layer 108 formed thereon is shown below, wherein the symbol "A" indicates the oxide layer A, and the symbol "B" indicates the oxide layer B; and x, y, and z were changed within the range of x+y+z=50 (where z was fixed at z=17). The total thickness of the antireflection layer was 60 nm.

Semiconductor layer/[Antireflection layer]=
Semiconductor layer/[A(x nm)/B(5 nm)/A(y nm)/B(5 nm)/A(z nm)]

Other operations and conditions were the same as in Example 1.

Table 2 shows the reflectiveness, photoelectric transducing efficiencies, and crystal grain sizes at the antireflection layer surfaces of the samples prepared in this Example. The reflectivities were measured at a wavelength of 500 nm. The photoelectric transducing efficiencies were calculated from the characteristics measured under illumination of AM 1.5 (100 mW/cm$^2$). The crystal grain sizes were measured with an electron microscope.

TABLE 2

| Sample | x | y | z | Reflectivity (%) | Photoelectric transducing efficiency (%) | Grain size of crystal (nm) |
|---|---|---|---|---|---|---|
| 2-1 | 23 | 10 | 17 | 15 | 9.3 | 27 |
| 2-2 | 21 | 12 | 17 | 10 | 9.3 | 22 |
| 2-3 | 20 | 13 | 17 | 8 | 9.6 | 18 |
| 2-4 | 17 | 16 | 17 | 8 | 9.7 | 15 |
| 2-5 | 13 | 20 | 17 | 8 | 9.5 | 20 |
| 2-6 | 12 | 21 | 17 | 10 | 9.2 | 25 |
| 2-7 | 10 | 23 | 17 | 14 | 9.2 | 28 |

From Table 2, the crystal grain size was not larger than 20 nm at the surface of the antireflection layer when the thicknesses of each of the oxide layers A were not more than 20 nm or less, the antireflection layer had a reflectivity as low as 8%, a photoelectric transducing efficiency as high as 9.5% or more, was transparent in the visible light wavelength region, and had sufficiently low electric resistance. Accordingly, the optimal thickness of the oxide layers A is preferably not more than 20 nm.

EXAMPLE 3

The thicknesses of the oxide layers B constituting the antireflection layer were changed to 8 nm in this example, which is different from Example 2. The layer constitution of the photoelectric transducer having a semiconductor layer 104 and an antireflection layer 108 formed thereon is shown below. In the layer constitution shown below, the symbol "A" indicates the oxide layer A, and the symbol "B" indicates the oxide layer B; and x, y, and z were varied within the range of x+y+z=44 (where z was fixed at z=17). The total thickness of each antireflection layer was 60 nm.

Semiconductor layer/[Antireflection layer]=
Semiconductor layer/[A(x nm)/B(8 nm)/A(y nm)/B(8 nm)/A(z nm)]

Other operations and conditions were the same as in Example 2.

Table 3 shows the electric resistance of the samples prepared in this Example. This electric resistance is normalized by the sheet resistance of the sheet having an antireflection layer 108 which is constituted only of tin oxide and indium oxide and having a thickness of 60 nm.

TABLE 3

| Sample | x | y | z | Electric resistance |
|---|---|---|---|---|
| 3-11 | 7 | 20 | 17 | 1 |
| 3-2 | 9 | 18 | 17 | 1 |
| 3-3 | 10 | 17 | 17 | 1 |
| 2-4 | 13 | 14 | 17 | 1 |
| 3-5 | 17 | 10 | 17 | 1.3 |
| 3-6 | 18 | 9 | 17 | 1.6 |
| 3-7 | 20 | 7 | 17 | 2.2 |

From Table 3, the electric resistance (normalized) of the sheet was 1.5 or more, when the layer "y" thickness of the oxide layers A was less than 10 nm. This high electric resistance was not observed for the layer "x" thickness of less than 10 nm. It was presumed that when any of the oxide layers A had a thickness of less than 10 nm, the oxide layer A became an island-like film, and such oxide layer A was sandwiched between the oxide layers B and then was affected by the higher resistance of zinc oxide. Accordingly, the thicknesses of the oxide layers A are preferably not less than 10 nm.

EXAMPLE 4

The thicknesses of the oxide layers B constituting the antireflection layer 108 were varied in this example, which is different from Example 1. The layer constitution of the photoelectric transducer having a semiconductor layer 104 and an antireflection layer 108 formed thereon is shown below. In the layer constituting shown below, the symbol "A" indicates the oxide layer A, and the symbol "B" indicates the oxide layer B; and x and y were varied within the range of x+y=12. The total thickness of the antireflection layer was 60 nm.

Semiconductor layer/[Antireflection layer]=
Semiconductor layer/[A(16 nm)/B(5 nm)/A(16 nm)/B(5 nm)/A(16 mn)]

Other operations and conditions were the same as in Example 1.

Table 4 shows the reflectivities, photoelectric transducing efficiencies, and crystal grain sizes at the antireflection layer surfaces of the samples prepared in this Example. The reflectivities were measured at a wavelength of 500 nm. The photoelectric transducing measured of 500 nm. The photoelectric transducing efficiencies were calculated from the characteristics measured under illumination of AM 1.5 (100 mW/cm$^2$). The crystal grain sizes were measured with an electron microscope.

TABLE 4

| Sample | x | y | Reflectivity (%) | Photoelectric transducing efficiency (%) | Grain size of crystal (nm) |
| --- | --- | --- | --- | --- | --- |
| 4-1 | 2 | 10 | 15 | 9.2 | 28 |
| 4-2 | 3 | 9 | 13 | 9.3 | 24 |
| 4-3 | 4 | 8 | 10 | 9.3 | 21 |
| 4-4 | 5 | 7 | 8 | 9.5 | 18 |
| 4-5 | 6 | 6 | 8 | 9.7 | 15 |

From Table 4, the crystal grain size was not larger than 20 nm at the surface of the antireflection layer, when the thickness of both oxide layers B were not less than 5 nm. When the crystal grain diameter was 20 nm or less, the antireflection layer had a reflectivity of as low as 8%, and the photoelectric transducing efficiency was as high as 9.5% or more, the layer was transparent in the visible light wavelength region, and had a sufficiently low electric resistance. It was presumed that when the oxide layer B had a thickness of less than 5 nm, the oxide layer B became an island-like film, and the oxide layers A were brought into contact with each other via such discontinuous oxide layer B and thus increased the irregularity of the oxide layer A, resulting in an increase of the reflectivity of the antireflection layer. Accordingly, the thicknesses of the oxide layers B are preferably not less than 5 nm.

EXAMPLE 5

The oxide layers A constituting the antireflection layer 108 were formed in thicknesses of 16 nm, 14 nm, and 12 nm respectively from the semiconductor layer side in this example, which is different from Example 4. The layer constitution of the photoelectric transducer having a semiconductor layer 104 and an antireflection layer 108 formed thereon is shown below. In the layer constitution shown below, the symbol "A" indicates the oxide layer A, and the symbol "B" indicates the oxide layer B; and x and y were varied within the range of x+y=18. The total thickness of the antireflection layer was 60 nm.

Semiconductor layer/[Antireflection layer]=
Semiconductor layer/[A(16 nm)/B(x nm)/A(14 nm/B(y nm)/A(12 nm)]

Other operations and conditions were the same as in Example 4.

Table 5 shows the electric resistance of the samples prepared in this Example. This electric resistance is normalized with the sheet resistance for the sheet having an antireflection layer 108 which is constituted only of tin oxide and indium oxide and having a thickness of 60 nm.

TABLE 5

| Sample | x | y | Electric resistance |
| --- | --- | --- | --- |
| 5-1 | 9 | 9 | 1 |
| 5-2 | 10 | 8 | 1.2 |
| 5-3 | 11 | 7 | 1.5 |
| 5-4 | 12 | 6 | 1.8 |
| 5-5 | 13 | 5 | 2.1 |

From Table 5, the electric resistance (normalized) of the sheet is less than 1.5, when the thickness of the respective oxide layers B is not more than 10 nm. When the thickness of the respective oxide layers B is larger than 10 nm, the electric resistance of the antireflection layer 108 serving as the transparent electrode is higher, which will cause loss of power and thus is not desirable. Accordingly, the thicknesses of the oxide layers B are preferably not more than 10 nm.

As described above, the present invention provides a photoelectric transducer which effectively utilizes the incident light to give high transducing efficiency with a smaller light introduction area.

What is claimed is:

1. A photoelectric transducer comprising a first electrode, a second electrode constituted of an antireflection layer, and a photoelectric semiconductor layer between the first electrode and the second electrode, wherein said antireflection layer comprises a laminated member of a first thin conductive oxide layer containing a first crystalline oxide of grain size of not larger than 20 nm and a second thin conductive oxide layer containing a second oxide of a second crystalline oxide of grain size of not larger than 20 nm, wherein the thickness d of the laminate is equal to the wavelength of light absorbed by the photoelectric semiconductor layer divided by 4n, where n is the composite refractive index of the layers of the antireflection laminate.

2. The photoelectric transducer according to claim 1, wherein the laminated member is formed by alternately laminating one or more of the first thin oxide layers and one or more of the second thin oxide layers.

3. The photoelectric transducer according to claim 1, wherein the first thin oxide layer comprises at least one metal oxide selected from oxides of cadmium, indium, and tin, and the second thin oxide layer comprises at least one metal oxide selected from oxides of zinc and titanium.

4. The photoelectric transducer according to claim 3, wherein one or more of the first thin oxide layers and one or more of the second thin oxide layers are alternately laminated.

5. The photoelectric transducer according to claim 1, wherein the first thin oxide layer comprises at least one metal oxide selected from oxides of cadmium, indium, and tin and has a thickness ranging from 10 to 20 nm, and the second thin oxide layer comprises at least one metal oxide selected from oxides of zinc and titanium and has a thickness ranging from 5 to 10 nm.

6. The photoelectric transducer according to claim 5, wherein one or more of the first thin oxide layers and one or more of the second thin oxide layers are alternately laminated.

7. The photoelectric transducer according to claim 1, wherein the semiconductor layer comprises amorphous silicon.

8. The photoelectric transducer according to claim 1, wherein the semiconductor layer comprises microcrystalline silicon.

9. The photoelectric transducer according to claim 1, wherein the semiconductor layer has a pin junction or an nip junction.

10. The photoelectric transducer according to claim 1, wherein the first electrode is an electroconductive base member.

11. The photoelectric transducer according to claim 10, wherein the electroconductive base member is a stainless steel plate, a galvanized steel plate, an aluminum plate, or a copper plate.

12. The photoelectric transducer according to claim 10, wherein a reflective metal layer is provided on the electroconductive base member.

13. The photoelectric transducer according to claim 10, wherein a reflective metal layer and a transparent electroconductive layer are provided on the electroconductive base member.

14. The photoelectric transducer according to claim 13, wherein the transparent electroconductive layer is a zinc oxide layer having fine projections and recesses on the surface thereof.

15. The photoelectric transducer according to claim 1, wherein a transparent electrode is provided between the antireflection layer and the semiconductor layer.

16. The photoelectric transducer according to claim 1, wherein a transparent electrode is provided on a surface of the antireflection layer opposite to the semiconductor layer.

17. The photoelectric transducer according to claim 1, wherein the antireflection layer is provided adjacently to a transparent base member and said semiconductor layer is provided on a surface of the antireflection layer.

18. The photoelectric transducer according to claim 1, wherein said second thin conductive oxide layer is thinner than said first thin conductive oxide layer.

19. An antireflection layer supported on a base member, adapted for use with a photoelectric semiconductor layer, comprising a laminated member of a first thin conductive oxide layer containing a first crystalline oxide of grain size of not larger than 20 nm, and a second thin conductive oxide layer containing a second crystalline oxide of grain size of not larger than 20 nm, wherein the thickness d of the laminate is equal to the wavelength of light absorbed by the photoelectric semiconductor layer divided by 4n, where n is the composite refractive index of the layers of the antireflection laminate.

20. The antireflection layer according to claim 19, wherein the laminated member is formed by alternately laminating one or more of the first thin oxide layers and one or more of the thin second oxide layer.

21. The antireflection layer according to claim 19, wherein the first thin oxide layer contains at least one metal oxide selected from oxides of cadmium, indium, and tin, and the second thin oxide layer contains at least one metal oxide selected from oxides of zinc and titanium.

22. The antireflection layer according to claim 21, wherein one or more of the first thin oxide layers and one or more of the second thin oxide layers are alternately laminated.

23. The antireflection layer according to claim 19, wherein the first thin oxide layer contains at least one metal oxide selected from oxides of cadmium, indium, and tin and has a thickness ranging from 10 to 20 nm, and the second thin oxide layer contains at least one metal oxide selected from oxides of zinc and titanium and has a thickness ranging from 5 to 10 nm.

24. The antireflection layer according to claim 23, wherein one or more of the first thin oxide layers and one or more of the second thin oxide layers are alternately laminated.

25. The antireflection layer according to claim 19, wherein said second thin conductive oxide layer is thinner than said first thin conductive oxide layer.

26. An electrode comprising a laminated member having a first thin conductive oxide layer containing a first crystalline oxide of grain size of not larger than 20 nm and a second thin conductive oxide layer containing a second crystalline oxide of grain size of not larger than 20 nm, and a base member supporting said laminated member.

27. The electrode according to claim 26, wherein the laminated member is formed by alternately laminating one or more of the first thin oxide layers and one or more of the thin second oxide layers.

28. The electrode according to claim 26, wherein the first thin oxide layer contains at least one metal oxide selected from oxides of cadmium, indium, and tin, and the second thin oxide layer contains at least one metal oxide selected from oxides of zinc and titanium.

29. The electrode according to claim 28, wherein one or more of the first thin oxide layers and one or more of the second thin oxide layers are alternately laminated.

30. The electrode according to claim 26, wherein the first thin oxide layer contains at least one metal oxide selected from oxides of cadmium, indium, and tin and has a thickness ranging from 10 to 20 nm, and the second thin oxide layer contains at least one metal oxide selected from oxides of zinc and titanium and has a thickness ranging from 5 to 10 nm.

31. The electrode according to claim 30, wherein one or more of the first thin oxide layers and one or more of the second thin oxide layers are alternately laminated.

32. The electrode according to claim 26, wherein said second thin conductive oxide layer is thinner than said first thin conductive oxide layer.

* * * * *

UNITED STATES PATENT AND TRADEMARK OFFICE
CERTIFICATE OF CORRECTION

PATENT NO. : 5,718,773

DATED : February 17, 1998

INVENTOR(S) : ATSUSHI SHIOZAKI

It is certified that error appears in the above-identified patent and that said Letters Patent is hereby corrected as shown below:

COLUMN 10

Line 48, "constituting" should read --constitution--.

COLUMN 13

Line 32, "layer." should read --layers.--.

Signed and Sealed this

Twenty-first Day of July, 1998

Attest:

BRUCE LEHMAN

Attesting Officer      Commissioner of Patents and Trademarks